(12) United States Patent
Kostylev (10) Patent No.: US 8,098,517 B2
(45) Date of Patent: Jan. 17, 2012

(54) METHOD OF RESTORING VARIABLE RESISTANCE MEMORY DEVICE

(75) Inventor: Sergey A. Kostylev, Bloomfield Hills, MI (US)

(73) Assignee: Ovonyx, Inc., Troy, MI (US)

( * ) Notice: Subject to any disclaimer, the term of this patent is extended or adjusted under 35 U.S.C. 154(b) by 1045 days.

(21) Appl. No.: 11/981,343

(22) Filed: Oct. 31, 2007

(65) Prior Publication Data

US 2009/0109737 A1 Apr. 30, 2009

(51) Int. Cl.
*G11C 11/00* (2006.01)

(52) U.S. Cl. ......................................... 365/163; 365/148

(58) Field of Classification Search .................... 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754
See application file for complete search history.

(56) References Cited

U.S. PATENT DOCUMENTS

| | | | | |
|---|---|---|---|---|
| 5,166,758 A | * | 11/1992 | Ovshinsky et al. | 257/3 |
| 5,296,716 A | * | 3/1994 | Ovshinsky et al. | 257/3 |
| 5,406,509 A | * | 4/1995 | Ovshinsky et al. | 365/113 |
| 5,837,564 A | * | 11/1998 | Sandhu et al. | 438/95 |
| RE37,259 E | * | 7/2001 | Ovshinsky | 365/163 |
| 6,795,338 B2 | * | 9/2004 | Parkinson et al. | 365/163 |
| 6,815,744 B1 | * | 11/2004 | Beck et al. | 257/295 |
| 2004/0160818 A1 | * | 8/2004 | Rinerson et al. | 365/171 |
| 2005/0029502 A1 | * | 2/2005 | Hudgens | 257/4 |
| 2006/0203541 A1 | * | 9/2006 | Toda | 365/163 |
| 2008/0101111 A1 | * | 5/2008 | Chang | 365/163 |

* cited by examiner

*Primary Examiner* — Richard Elms
*Assistant Examiner* — Harry W Byrne
(74) *Attorney, Agent, or Firm* — Kevin L. Bray (57) ABSTRACT

Methods of programming a phase-change memory device that remedy device failure. The methods includes applying a sequence of two or more electrical energy pulses to the device, where the sequence of pulses includes positive polarity pulses and negative polarity pulses. In one method, two or more pulses of an initial polarity are applied and are followed by one or more pulses having opposite polarity. In another method, pulses of an initial polarity are repeatedly applied until the device fails and one or more pulses of opposite polarity are subsequently applied to restore the device to its initial performance. The pulses may be set pulses, reset pulses, or pulses that produce programmed states having a resistance intermediate between the set resistance and reset resistance of the device.

35 Claims, 5 Drawing Sheets

METHOD OF RESTORING VARIABLE RESISTANCE MEMORY DEVICE

FIELD OF INVENTION

This invention pertains to binary and multistate memory devices. More particularly, this invention relates to memory devices having two or more memory states distinguishable on the basis of electrical resistance. Most particularly, this invention relates to methods of programming phase-change memory devices that facilitate prolongation of operational lifetime.

BACKGROUND OF THE INVENTION

Chalcogenide materials are an emerging class of commercial electronic materials that exhibit switching, memory, logic, and processing functionality. The basic principles of chalcogenide materials were developed by S. R. Ovshinsky in the 1960's and much effort by him and others around the world since then have led to advancements of the underlying science and an expansion of the field of application of chalcogenide materials.

Early work in chalcogenide devices demonstrated electrical switching behavior in which switching from a resistive state to a conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds for over $10^{13}$ cycles. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Another important application of chalcogenide materials is in electrical and optical memory devices. One type of chalcogenide memory device utilizes the wide range of resistance values available for the active chalcogenide material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Each memory state of a chalcogenide memory material corresponds to a distinct resistance value and each memory resistance value signifies unique informational content. Operationally, the chalcogenide material can be programmed into a particular memory state by providing energy, most commonly an electric current pulse of appropriate amplitude and duration, to transform the chalcogenide material into the structural state having the resistance value associated with the particular informational content to be stored. By controlling the amount of energy provided to a chalcogenide material, it is possible to control the relative proportions of crystalline and amorphous phase regions within a volume of the material and to thereby control the structural (and memory) state of the chalcogenide material.

Each memory state can be programmed by providing the current pulse characteristic of the state and each state can be identified or read in a non-destructive fashion by measuring the resistance. Programming among the different states is fully reversible and the memory devices can be written and read over a repeated number of cycles to provide robust and reliable operation. The variable resistance memory functionality of chalcogenide materials is currently being exploited in the OUM (Ovonic Universal (or Unified) Memory) devices that are expected to appear on the market soon. Basic principles and operation of OUM type devices are presented, for example, in U.S. Pat. Nos. 6,859,390; 6,774,387; 6,687,153; and 6,314,014; the disclosures of which are incorporated by reference herein as well as in several journal articles including "Low Field Amorphous State Resistance and Threshold Voltage Drift in Chalcogenide Materials", published in IEEE Transactions on Electron Devices, vol. 51, p. 714-719 (2004) by Pirovana et al.; and "Morphing Memory" published in IEEE Spectrum, vol. 167, p. 363-364 (2005) by Weiss.

The behavior (including switching, memory, and accumulation) and chemical compositions of chalcogenide materials included within the scope of this invention have been described, for example, in U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references also describe proposed mechanisms that govern the behavior of the chalcogenide materials. The references also describe the structural transformations from the crystalline state to the amorphous state (and vice versa) via a series of partially crystalline states in which the relative proportions of crystalline and amorphous regions vary underlying the operation of electrical and optical chalcogenide materials. Similar structural transformations have been reported more recently for the pnictide family of materials.

Current development of the chalcogenide materials and devices is also oriented toward the fabrication of arrays of devices. Chalcogenide materials offer the promise of high density memory, logic and neural arrays that can operate according to traditional binary data storage or according to a multilevel scheme. Chalcogenide arrays further offer the prospect of integrating, on a single chip, both memory and processing capabilities, thereby enabling high speed operation.

In order to expand the commercial opportunities for chalcogenide or pnictide phase-change memories, it is necessary to identify phase-change materials, device structures, and methods of programming that lead to optimized performance. Among the desirable operational characteristics are a high contrast between the resistances of the reset state and set state, low reset current, scalability of performance with decreasing device size, fast crystallization, reproducible performance over multiple cycles of operation, avoidance or inhibition of atomic migration, compositional stability, good adhesion between the active phase-change material and the electric contacts and surrounding layers of the device, stable long term storage of data, and consistent performance over a wide range of ambient conditions (including temperature and working environment).

SUMMARY OF THE INVENTION

The instant invention provides a method of programming phase-change memory devices that prolongs the operational life of the device. In one embodiment, the instant invention provides a method of programming a phase-change memory material or device that includes subjecting the material or device to a current or voltage pulse having one polarity and then subjecting the material or device to a current or voltage pulse having opposite polarity. In one embodiment, a positive polarity pulse is followed by a negative polarity pulse. In another embodiment, a negative polarity pulse is followed by a positive polarity pulse.

In another embodiment, the instant invention provides a method of programming a phase-change material or device that includes subjecting the material or device to a plurality of current or voltage pulses of one polarity and then subjecting the material or device to one or more current or voltage pulses having opposite polarity. In one embodiment, two or more positive polarity pulses are applied to the phase-change material or device and then one or more negative polarity pulses are applied. In another embodiment, two or more negative polarity pulses are applied to the phase-change material or device and then one or more positive polarity pulses are applied.

In another embodiment, the instant invention provides a method of programming a phase-change material or device that includes subjecting the material or device to an alternating series of positive polarity and negative polarity pulses. One or more positive polarity pulses may be followed by one or more negative polarity pulse may be followed by one or more positive polarity pulses etc. One or more negative polarity pulses may be followed by one or more positive polarity pulse may be followed by one or more negative polarity pulses etc.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The instant invention provides a method of programming phase-change memory devices. The method extends the cycle life of phase-change memory devices by restoring performance following a degradation of performance that may occur after prolonged cycling of the device. In order to appreciate the benefits of the instant invention, it is helpful to review the basic operational characteristics of phase-change memory materials and devices. The following discussion focuses on chalcogenide materials as illustrative phase-change material. The basic principles apply equally to other forms of phase-change or state-change materials, such as pnictides or other classes of materials transformable between two or more states distinguishable on the basis of structure, physical property or chemical property.

An important feature of the chalcogenide materials in the operation of chalcogenide memory devices and device arrays is their ability to undergo a phase transformation between or among two or more structural states. The chalcogenide materials have structural states that include a crystalline state, one or more partially-crystalline states and an amorphous state. The crystalline state may be a single crystalline state or a polycrystalline state. As used herein, a partially-crystalline state refers to a structural state of a volume of chalcogenide material that includes an amorphous portion and a crystalline portion. Generally, a plurality of partially-crystalline states exists for the phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the partially-crystalline states have fractional crystallinities that vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states of a chalcogenide material are induced by providing energy to the chalcogenide material. Energy in various forms can influence the fractional crystallinity of a chalcogenide material and hence induce structural transformations. Suitable forms of energy include electrical energy, thermal energy, optical energy or other forms of energy (e.g. particle-beam energy) that induce electrical, thermal or optical effects in a chalcogenide material or combinations of the foregoing forms of energy. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline or amorphous state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state is lower than the free energy of an amorphous state so that the overall energy of a chalcogenide material decreases as the fractional crystallinity increases. Formation (nucleation and growth) of a crystalline state or crystalline domains within a partially-crystalline state is kinetically enabled, so that heating below the melting point promotes crystallization by providing energy that facilitates the rearrangements of atoms needed to form a crystalline phase or domain. The fractional crystallinity of a partially-crystalline state can be controlled by controlling the temperature or time of heating of the partially-crystalline state or by controlling the temperature or rate of cooling of an amorphous or partially-crystalline state.

Figure 1:
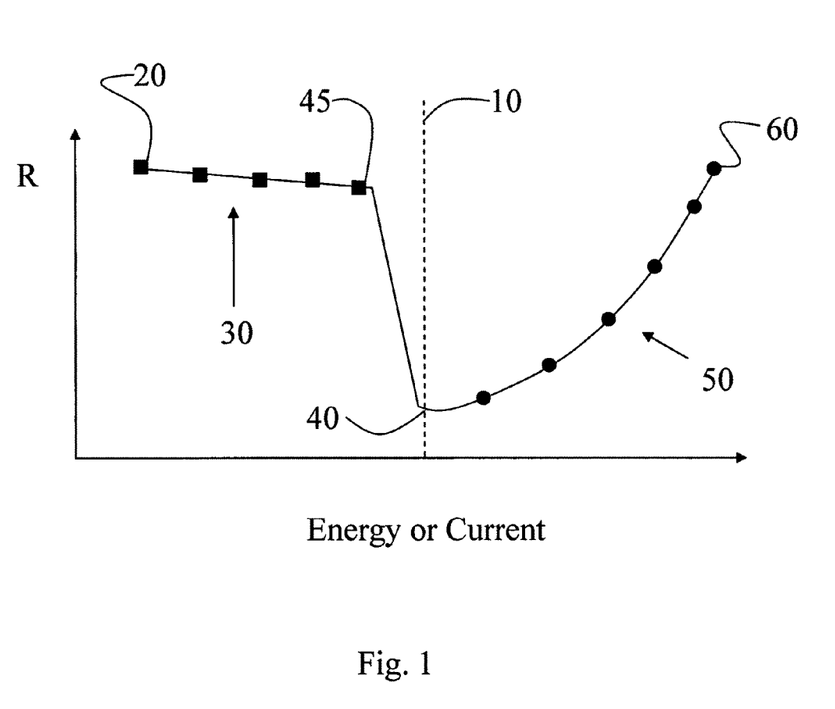
FIG. 1 is an illustrative Resistance vs. Energy/Current plot for a typical phase-change material.

The use of electrical energy to induce structural transformations relies on the application of electrical (current or voltage) pulses to a chalcogenide material. The mechanism of electrically induced structural transformations may be electronic in nature, possibly with an accompanying or consequent thermal contribution. By controlling the magnitude and/or duration of electrical pulses applied to a chalcogenide material, it is possible to vary continuously the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 1 herein. FIG. 1 shows the variation of the electrical resistance of a chalcogenide material resulting from electrical energy or current pulses of various magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance at and beyond a critical energy (which may be referred to herein as the set energy). The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping. The left side of the resistance plot is referred to as the accumulating regime because the structural state of the chalcogenide material continuously evolves as energy is applied, with the fractional crystallinity of the structural state correlating with the total accumulation of applied energy. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the fractional crystallinity increases, and the chalcogenide material transforms in the direction of increasing applied energy among a plurality of partially-crystalline states along the plateau 30. Selected accumulation states (structural states in the accumulation region) are marked with squares in FIG. 1. Upon accumulation of a sufficient amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting. The behavior illustrated in FIG. 1 is reproducible over many cycles of setting and resetting a device containing a chalcogenide material by applying the requisite energy or current. Once the reset state is obtained, lower amplitude current pulses can be applied and the accumulation response of the chalcogenide material can be retraced. It is thus possible to cycle between the set and reset states over multiple cycles, a necessary feature for long memory cycle life.

While not wishing to be bound by theory, the instant inventors believe that the addition of energy to a chalcogenide material in the accumulating regime leads to an increase in fractional crystallinity through the nucleation of new crystalline domains or growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material between the two device electrodes. This type of crystallization may be referred to as sub-percolation crystallization. The setting transformation coincides with a percolation threshold in which a contiguous, interconnected crystalline network forms within the chalcogenide material between the two device electrodes. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 1 may be referred to as the grayscale or direct overwrite regime. The grayscale regime extends from the set state 40 through a plurality of intermediate states (generally depicted by 50) to a reset point or state 60. The various points in the grayscale regime may be referred to as grayscale or direct overwrite states of the chalcogenide material. Selected grayscale states are marked with circles in FIG. 1. Structural transformations in the grayscale regime may be induced by applying an electric current or voltage pulse to a chalcogenide material. In FIG. 1, an electric current pulse is indicated. In the grayscale regime, the resistance of the chalcogenide material varies with the magnitude of the applied electric pulse. The resistance of a particular state in the grayscale regime is characteristic of the structural state of the chalcogenide material, and the structural state of a chalcogenide material is dictated by the magnitude of the current pulse applied in the grayscale region. The fractional crystallinity of the chalcogenide material decreases as the magnitude of the current pulse increases. The fractional crystallinity is highest for grayscale states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the grayscale region.

In contrast to the accumulating region, structural transformations that occur in the grayscale region are reversible, bi-directional, and this region may thus also be referred to as the direct overwrite region of the resistance plot. As indicated hereinabove, each state in the grayscale region may be identified by its resistance and a current pulse magnitude, where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the grayscale resistance curve. Similarly, if the subsequent current pulse has a lower magnitude than the pulse used to establish the initial state, the fractional crystallinity of the chalcogenide material increases and the structural state is transformed from the initial state in the direction of the set state along the grayscale resistance curve.

In OUM (Ovonic Unified (or Universal) Memory) applications, the grayscale states of the chalcogenide material are used to define memory states of a memory device. Most commonly, the memory devices are binary memory devices that utilize two of the grayscale states as memory states, where a distinct information value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value as exemplified, for example, by the grayscale states in FIG. 1. The operation of transforming a chalcogenide material to the structural state associated with a particular memory state may be referred to herein as programming the chalcogenide material or writing to the chalcogenide material or storing information in the chalcogenide material.

To facilitate readout and to minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device.

For a layer of phase-change material having the composition $Ge_{22}Sb_{22}Te_{56}$, a thickness of ~600 Å, and pore diameter of below ~0.1 µm in a typical two-terminal device structure, for example, the resistance of the reset state is ~100-1000 kΩ and the resistance of the set state is under ~10 kΩ. Phase-change materials in general show resistances in the range of ~100 kΩ to ~1000 kΩ in the reset state and resistance of ~0.5 kΩ to ~50 kΩ in the set state. In the preferred phase-change materials, the resistance of the reset state is at least a factor of two, and more typically an order of magnitude or more, greater than the resistance of the set state. In addition to binary (single bit) memory applications, chalcogenide materials may be utilized as non-binary or multiple bit memory materials by selecting three or more states from among the grayscale states and associating an information value with each state, where each memory state corresponds to a distinct structural state of the chalcogenide and is characterized by a distinct resistance value.

Representative compositions of chalcogenide materials have been discussed in U.S. Pat. Nos. 5,543,737; 5,694,146; 5,757,446; 5,166,758; 5,296,716; 5,534,711; 5,536,947; 5,596,522; and 6,087,674; the disclosures of which are hereby incorporated by reference in their entirety herein. The chalcogenide materials generally include one or more elements from column VI of the periodic table (the chalcogen elements) and optionally one or more chemical modifiers from columns III, IV or V. One or more of S, Se, and Te are the most common chalcogen elements included in a chalcogenide phase-change material. Suitable modifiers include one or more of trivalent and tetravalent modifying elements such as As, Ge, Ga, Si, Sn, Pb, Al, Sb, In, and Bi. Transition metals such as Cu, Ni, Zn, Ag, and Cd may also be used as modifiers. A preferred chalcogenide composition includes one or more chalcogenide elements along with one or more trivalent or tetravalent modifiers and/or one or more transition metal modifiers. Materials that include Ge, Sb, and/or Te, such as $Ge_2Sb_2Te_5$, are examples of chalcogenide materials in accordance with the instant invention. Other examples of phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge_{15}Sb_2S_2$ and quaternary Te—Ge—Sb—S compositions. U.S. Pre-Grant Pubs. 20070034850 and 20070034851, the disclosures of which are hereby incorporated by reference in their entirety, disclose phase-change materials having reduced Ge and/or Te content.

An important practical requirement for phase-change memory devices is the ability of the device to perform reliably and reproducibly over multiple cycles of operation. The longevity of phase-change memory devices is controlled by the consistency of resistance values upon application of programming pulses having a particular set of pulse energy characteristics (e.g. pulse duration, pulse shape, pulse amplitude). When a particular programming pulse is applied in the direct overwrite memory region, it is necessary for the resistance of the device to transform to its expected value and for this value to occur reproducibly over the full operational life of the device.

A common mode of failure of phase-change memory devices occurs when resistance values are no longer reproducibly established as expected upon application of a particular programming pulse. In binary operation, for example, it is common to cycle between the set state and reset state. The set state is programmed with a set pulse and the reset state is programmed with a reset pulse. The set pulse is commonly a relatively low amplitude, long duration pulse and the reset pulse is commonly a relatively high amplitude, short duration pulse. (For background information on pulse attributes needed to program and read phase-change memory devices see, for example, U.S. Pat. No. 6,570,784 to Lowrey, the disclosure of which is hereby incorporated herein in its entirety.) In some instances after repeated cycles of operation, the device fails because the set pulse is no longer capable of transforming the phase-change material to its set state. The device instead remains in its reset state despite being subjected to a programming pulse. This mode of failure is sometimes referred to as a "stuck reset condition" or "stuck reset failure". In other instances after repeated cycles of operation, the device fails because the reset pulse is no longer capable of transforming the phase-change material to its reset state. Instead, the device remains in its set state despite being subjected to a programming pulse. This mode of failure is sometimes referred to as a "stuck set condition" or "stuck set failure".

The instant invention provides a method for remedying device failure caused by the stuck set condition or stuck reset condition. In typical device operation, the programming pulses (set pulses, reset pulses, or pulses that produce direct overwrite states having intermediate resistance) applied over the multiple cycles of operation have the same polarity. For example, positive polarity reset pulses may be used to program the device to the reset state and positive polarity set pulses may be used to program the device to the set state. During operation, the positive polarity reset pulses and positive polarity set pulses may be applied in an alternating sequence to transform the device between two binary memory states. In multistate devices, positive polarity pulses may further be used to program the device to states having a resistance intermediate between the set resistance and the reset resistance.

While not wishing to be bound by theory, the instant inventor believes that repeated application of same-polarity pulses (whether positive polarity or negative polarity) may contribute to device failure. Repeated application of programming pulses having a particular polarity may, especially in combination with the elevated temperatures formed in the device during programming, induce the thermal or electromigration (or diffusion) of elements within or between the phase-change material, electrical contact materials, or surrounding insulator layers. The atomic migration effect associated with one cycle of operation is believed to be inconsequential and perhaps even undetectable, but the cumulative effect over a large number of cycles may be a contributing factor in device failure as a progressive alteration in the composition, structure, or interactions of one or more layers may result.

While still not wishing to be bound by theory, a further effect contributing to device failure may be the accumulation of crystalline phase material in the vicinity of one of the electrical contacts. When programming a phase-change device, the transformation from a crystalline phase to an amorphous phase frequently occurs preferentially in the vicinity of only one of the contacts. If, for example, the resistivities of the two device contacts differ, transformations to the amorphous phase may occur preferentially in the vicinity of the higher resistivity contact. This follows because the higher resistivity contact experiences a greater degree of Joule heating when current passes through it so that a higher local temperature is achieved. The higher temperature facilitates the transformation to the amorphous state. In some device designs, dissipation of heat is greater at one contact than the other (e.g. due to differences in heat sinking or thermal conductivity of surrounding layers). The contact that experiences greater heat dissipation is less able to maintain the higher temperatures needed to form an amorphous phase, so the crystalline-to-amorphous phase transition occurs preferentially at the contact that suffers lesser heat dissipation. In still other device designs, the cross-sectional area of the phase-change layer may not be uniform between the two contacts. Non-uniformity in cross-sectional area leads to differences in current density in the vicinity of the two contacts. A smaller cross-sectional area leads to a higher current density and greater heating. Formation of an amorphous phase is thus favored in the vicinity of the contact adjacent to a portion of the phase-change material having a smaller cross-section.

Regardless of the origin of the effect, when preferential amorphous phase formation occurs in the vicinity of one contact, there may be an accumulation of crystalline phase material in the vicinity of the other contact. This crystalline phase material may function as a virtual contact for the device. Upon repeated cycling over the lifetime of a device, the accumulation of crystalline phase material may grow at the expense of the region in the vicinity of the other contact in which programming to the amorphous phase occurs. The net effect of the accumulation may be a reduction in the overall volume of phase-change material that can be programmed to the amorphous state. As a result, the fractional crystallinity of the phase-change material between the two electrodes increases and an overall reduction in resistance is observed. If the resistance decreases to an unacceptable level, device failure occurs.

The instant inventor has discovered that the deleterious cumulative effects of same-polarity pulse operation of phase-change memory devices can be ameliorated or even reversed upon application of an opposite polarity pulse to the device after failure. In one embodiment, the instant invention provides a method of programming a phase-change memory material or device that includes subjecting the material or device to a current or voltage pulse having one polarity and then subjecting the material or device to a current or voltage pulse having opposite polarity. In one embodiment, a positive polarity pulse is followed by a negative polarity pulse. In another embodiment, a negative polarity pulse is followed by a positive polarity pulse.

In another embodiment, the instant invention provides a method of programming a phase-change material or device that includes subjecting the material or device to a plurality of current or voltage pulses of one polarity and then subjecting the material or device to one or more current or voltage pulses having opposite polarity. In one embodiment, two or more positive polarity pulses are applied to the phase-change material or device and then one or more negative polarity pulses are applied. In another embodiment, two or more negative polarity pulses are applied to the phase-change material or device and then one or more positive polarity pulses are applied.

In another embodiment, the instant invention provides a method of programming a phase-change material or device that includes subjecting the material or device to an alternating series of positive polarity and negative polarity pulses. One or more positive polarity pulses may be followed by one or more negative polarity pulse may be followed by one or more positive polarity pulses etc. One or more negative polarity pulses may be followed by one or more positive polarity pulse may be followed by one or more negative polarity pulses etc.

In the foregoing embodiments, the positive polarity pulse may be a reset pulse and the negative polarity pulse may be a reset pulse, a set pulse, or a pulse capable of programming the device to a state having a resistance intermediate between the reset resistance and the set resistance. Alternatively, the positive polarity pulse may be a set pulse and the negative polarity pulse may be a reset pulse, a set pulse, or a pulse capable of programming the device to a state having a resistance intermediate between the reset resistance and the set resistance. In another embodiment, the positive polarity pulse may be pulse capable of programming the device to a state having a resistance intermediate between the reset resistance and the set resistance and the negative polarity pulse may be a reset pulse, a set pulse, or a pulse capable of programming the device to a state having a resistance intermediate between the reset resistance and the set resistance.

The foregoing methods generally describe methods in which an earlier pulse of energy having an initial polarity is followed by a later pulse of energy having an opposite polarity. The opposite polarity pulse may have the same or different (higher or lower) energy than the initial polarity pulse. In one embodiment, the opposite polarity pulse has an energy that is 70%-90% of the energy of the initial polarity pulse. In another embodiment, the opposite polarity pulse has an energy that is 80%-140% of the energy of the initial polarity pulse. In still another embodiment, the opposite polarity pulse has an energy that is 110%-130% of the energy of the initial polarity pulse. The energy of a pulse depends on the amplitude of the pulse and the duration of the pulse. In one embodiment, the opposite polarity pulse has an amplitude of 50%-80% of the amplitude of the initial polarity pulse. In another embodiment, the opposite polarity pulse has a duration of 80%-120% of the duration of the initial polarity pulse. In still another embodiment, the opposite polarity pulse has an amplitude of 50%-80% of the amplitude of the initial polarity pulse and a duration of 80%-120% of the duration of the initial polarity pulse.

While not wishing to be bound by theory, the instant inventor believes that application of an opposite polarity pulse restores the device to acceptable operating conditions by counteracting the accumulation of crystalline phase material that may occur in the vicinity of one of the contacts. By switching the polarity of the pulse, the preferential localization of thermal energy can be switched to occur in the vicinity of the contact at which the accumulation occurs. This localization of thermal energy facilitates a melting and randomization of the accumulated crystalline material that may operate to restore or partially restore the performance of the device upon subsequent application of initial polarity pulses.

EXAMPLE 1

In this example, a method in accordance with the instant invention remedies a device failure that occurs after repeated cycles of same polarity pulses. The structure of the device used in this example is presented in FIG. 2. The device 100 includes base wafer 110, dielectric layer 120, lower conductive layer 130, lower conductive lead 140, via dielectric 150, phase-change material 160, upper conductive layer 170, dielectric 180, upper conductive layer 190, and conductive lead 200. The base wafer 110 is typically a silicon wafer. Dielectric layers 120, 150, and 180 are insulators such as oxides (e.g. silicon dioxide) or nitrides (e.g. silicon nitride). Conductive layers 130, 170, and 190 may be conductive or semi-resistive materials such as TiN, TiAlN, TiW, W, MoN, or C. Conductive leads 140 and 200 may be used to connect the device to external circuitry to permit introduction of electrical energy in the form of pulses or signals and may be a metal, metal alloy, or other conductive material. Phase-change material 160 was $Ge_2Sb_2Te_5$.

Figure 2:
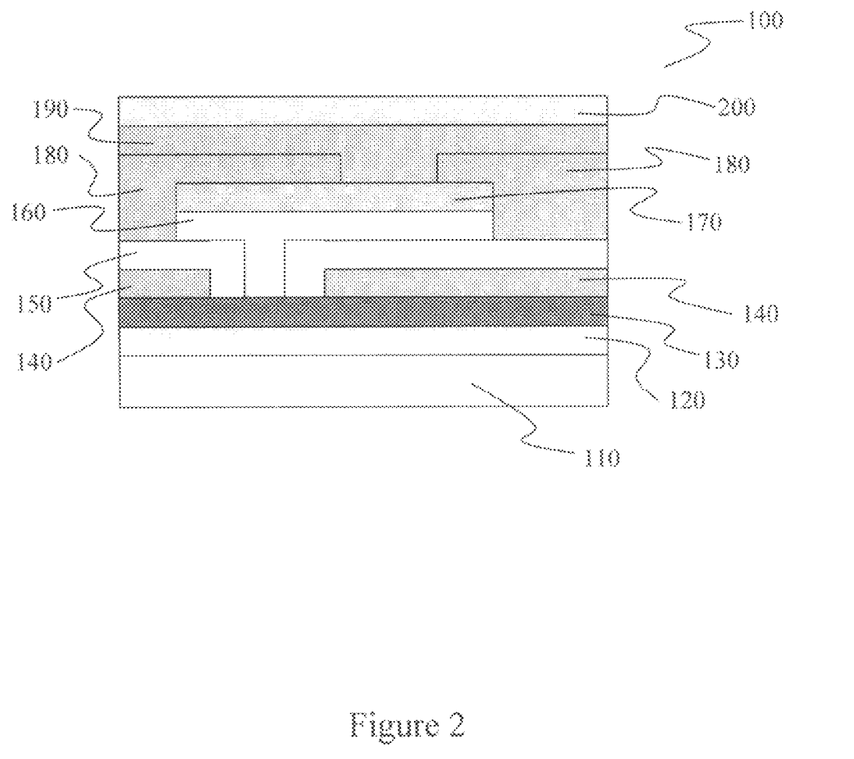
FIG. 2 is an illustrative structure of a phase-change memory device.

The device shown in FIG. 2 was subjected to cycling between the set state and reset state. Positive polarity set pulses and positive polarity reset pulses were applied in alternation. For purposes of this example, positive polarity means that the potential of upper conductive layer 170 is higher than the potential of lower conductive layer 130. The pulses provided a voltage across phase-change material 160 between lower conductive layer 130 and upper conductive layer 170. The set pulses had a duration of 90 ns and a voltage sufficient to produce a current of 0.12 mA between upper conductive layer 170 and lower conductive layer 130. The reset pulses had a duration of 50 ns and a voltage sufficient to produce a current of 0.22 mA between upper conductive layer 170 and lower conductive layer 130. After each pulse was applied, the resistance of the device was measured. The variations of the set and reset resistances upon cycling are summarized in FIG. 3. At small cycle numbers, the set and reset resistances are approximately 100 kΩ and 10 MΩ, respectively. As the cycle number exceeds $10^9$ cycles and approaches $10^{10}$ cycles, the set and reset resistances were observed to decrease (at ~$6 \times 10^9$ cycles). The decrease in reset resistance was substantial and could not be reversed through continued cycling of the set and reset pulses. The marked decline in the reset resistance and inability to recover it constitutes a failure of the device.

Figure 3:
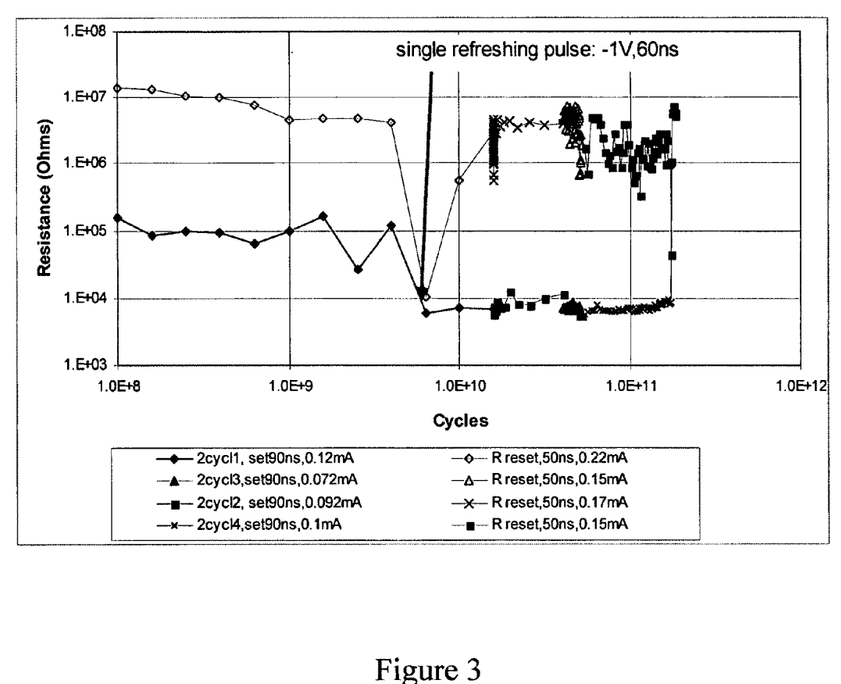
FIG. 3 is a plot of the cycling characteristics of the device shown in FIG. 2.

To remedy the failure and restore the reset resistance, a negative polarity pulse was applied to the device. The negative polarity pulse had a voltage of $-1$ V and a duration of 60 ns. After the negative polarity pulse was applied, additional cycling with positive polarity set and reset pulses was completed. The positive polarity set pulses following application of the negative polarity restoration pulse had a duration of 90 ns and a voltage sufficient to cause a current of between 0.07 and 0.10 mA to pass through phase-change material 160. The positive polarity reset pulses following application of the negative polarity restoration pulse had a duration of 50 ns and a voltage sufficient to cause a current amplitude of between 0.15 mA and 0.17 mA to pass through phase-change material 160. After application of the negative polarity restoration pulse, the reset resistance was observed to return to a value close to 10 MΩ and the device was observed to continue to cycle to above $10^{11}$ cycles. This example demonstrates that application of an opposite polarity pulse extends the operational lifetime of the memory device from less than $10^{10}$ cycles ($6 \times 10^9$ cycles) to more than $10^{11}$ cycles ($2 \times 10^{11}$ cycles).

EXAMPLE 2

In this example, a further illustration of a method in accordance with the instant invention remedies a device failure following repeated cycles of same polarity pulses. The device of the example is a breakdown layer device having the structure depicted in FIG. 4. The device 200 includes base wafer 210, a lower contact that includes lower conductive layer 220 and lower semi-resistive layer 230, dielectric layer 240, breakdown layer 250, phase-change material 260, upper semi-resistive layer 270, upper conductive layer 280, dielectric 290, upper conductive lead 295. The base wafer 210 is typically a silicon wafer. Dielectric layers 240 and 290 are insulators such as oxides (e.g. silicon dioxide) or nitrides (e.g. silicon nitride). Conductive layers 220 and 280 may be conductive materials such as TiN, TiAlN, TiW, W, or MoN and may be several hundred to a few thousand angstroms thick. Semi-resistive layers 230 and 270 may be a semi-resistive layer such as carbon and may be from several tens to several hundred angstroms thick. Conductive lead 295 may be used to connect the device to external circuitry to permit introduction of electrical energy in the form of pulses or signals and may be a metal, metal alloy, or other conductive material. Breakdown layer 250 is generally a thin (10-100 Å thick) dielectric material and facilitates the goal of minimizing programming energy by reducing the effective area of contact between semi-resistive layer 230 and phase-change material 260. Phase-change material 260 was $Ge_2Sb_2Te_5$.

Figure 4:
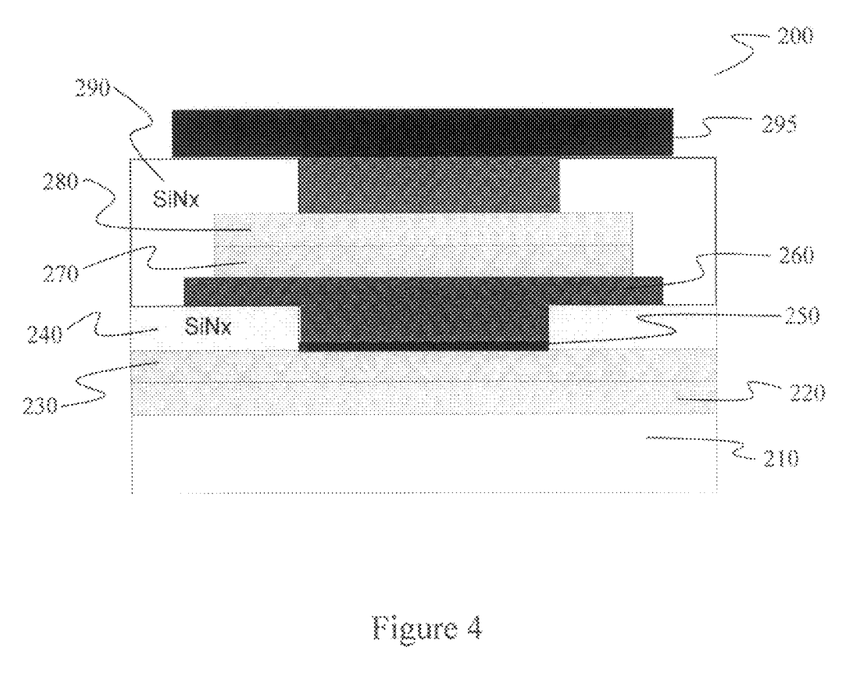
FIG. 4 is an illustrative structure of a phase change memory device.

The device shown in FIG. 4 was subjected to cycling between the set state and reset state. Positive polarity set pulses and positive polarity reset pulses were applied in alternation. For purposes of this example, positive polarity means that the potential of upper semi-resistive layer 270 is higher than the potential of lower semi-resistive layer 230. The pulses provided a voltage across phase-change material 160 between lower semi-resistive layer 230 and upper semi-resistive layer 270. The set pulses had a duration of 200 ns and a voltage sufficient to produce a current of 0.75 mA between upper conductive layer 280 and lower conductive layer 220. The reset pulses had a duration of 60 ns and a voltage sufficient to produce a current of 1.5-2.5 mA between upper conductive layer 280 and lower conductive layer 220. After each pulse was applied, the resistance of the device was measured. The variations of the set and reset resistances upon cycling are summarized in FIG. 5. At small cycle numbers, the set and reset resistances are approximately 1 k$\Omega$ and 100 k$\Omega$, respectively. As the cycle number approaches $10^8$ cycles, the reset resistance was observed to decrease sharply. The decrease in reset resistance could not be reversed through continued cycling of the set and reset pulses. The marked decline in the reset resistance and inability to recover it constitutes a failure of the device.

Figure 5:
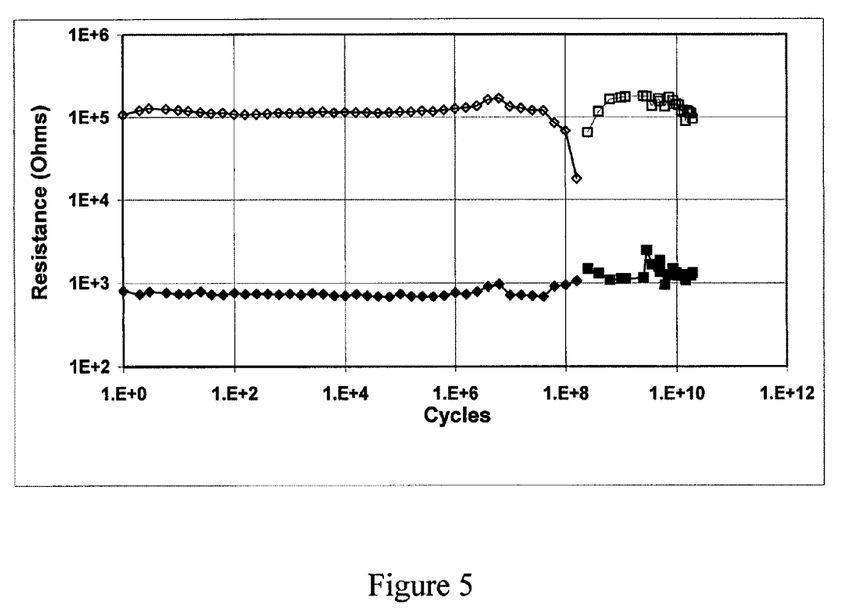
FIG. 5 is a plot of the cycling characteristics of the device shown in FIG. 2.

To remedy the failure and restore the reset resistance, a negative polarity restoration pulse was applied to the device. The negative polarity restoration pulse had a duration of 60 ns and an opposite-polarity (relative to the set and reset pulses) voltage sufficient to produce a current of 1.5 mA between upper conductive layer 280 and lower conductive layer 220. After the negative polarity pulse was applied, additional cycling with the positive polarity set and reset pulses was completed. After application of the negative polarity restoration pulse, the reset resistance was observed to return to a value close to 100 k$\Omega$ and the device was observed to continue to cycle to about $10^{10}$ cycles. This example demonstrates that application of an opposite polarity pulse extends the operational lifetime of the memory device from about $10^8$ cycles to about $10^{10}$ cycles.

In one implementation of the method of the instant invention, programming pulses of an initial polarity can be applied over a number of cycles until the resistance of the device upon application of a reset pulse falls below a predetermined value between the resistance of the reset state and the resistance of the set state. In one embodiment, the predetermined value is 75% of the reset resistance of the device. In another embodiment, the predetermined value is 50% of the reset resistance of the device. In still another embodiment, the predetermined value is 25% of the reset resistance of the device. When the reset resistance falls below the predetermined value, one or more opposite polarity restoration pulses may be applied. In one embodiment, a single opposite restoration polarity pulse is applied and application of the initial polarity set and reset pulses is resumed. In another embodiment, a plurality of opposite polarity restoration pulses is applied before resuming application of the initial polarity pulses. The number of opposite polarity restoration pulses may be a fixed number or the opposite polarity restoration pulses may be applied until the resistance of the device following application of the initial polarity reset pulse exceeds a predetermined value (which may the same or different from the predetermined value that signifies failure of the device).

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. The descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

I claim:

1. A method of programming an electronic device including: providing an electronic device, said electronic device including a phase-change memory device;
    applying one or more first polarity pulses to said device, said one or more first polarity pulses including at least two pulses applied in succession; and
    applying one or more second polarity pulses to said device.

2. The method of claim 1, further comprising applying said first polarity pulses and said second polarity pulses individually to said device in an alternating sequence.

3. The method of claim 1, wherein said first polarity pulses are applied until said device fails and said second polarity pulses are applied after said device fails.

4. The method of claim 3, further comprising the step of providing one or more of said first polarity pulses after applying said second polarity pulses.

5. The method of claim 3, wherein said first polarity pulses are positive polarity pulses and said second polarity pulses are negative polarity pulses.

6. The method of claim 1, wherein said first polarity pulses transform said device from a first state to a second state, said second state having a different resistance than said first state, said second state persisting upon repeated application of said first polarity pulses, said application of said second polarity pulses transforming said device to a state other than said second state.

7. The method of claim 1, further comprising the step of measuring the resistance of said device after application of each of said first polarity pulses.

8. The method of claim 7, further comprising the step of measuring the resistance of said device after application of each of said second polarity pulses.

9. The method of claim 1, wherein said first polarity pulses include first pulses having a first energy and second pulses having a second energy.

10. The method of claim 9, wherein said first pulses transform said device to a first state, said first state having a resistance that varies upon repeated application of said first pulses.

11. The method of claim 10, wherein said repeated application of said first pulses is continued until said resistance of said first state stabilizes.

12. The method of claim 11, wherein application of said second pulses to said stabilized first resistance state does not alter said stabilized resistance.

13. The method of claim 12, wherein application of said second polarity pulses to said stabilized first resistance state alters said stabilized resistance.

14. A method of programming an electronic device including:
providing an electronic device, said electronic device including a phase-change memory device, said phase-change memory device including a phase-change material in electrical communication with a first electrode and a second electrode, said phase-change material having a reset state achievable by applying a reset pulse to said device and a set state achievable by applying a set pulse to said device;
applying one or more first polarity pulses to said device; and
applying one or more second polarity pulses to said device.

15. The method of claim 14, wherein said phase-change material comprises a chalcogenide material.

16. The method of claim 14, wherein said phase-change material comprises Se or Te.

17. The method of claim 14, wherein said first polarity pulses include one or more of said reset pulses.

18. The method of claim 17, wherein said reset pulses are applied until the resistance of the device is less than a predetermined value after application of the last of said one or more reset pulses.

19. The method of claim 18, wherein said predetermined value is 75% of said reset resistance.

20. The method of claim 18, wherein said predetermined value is 50% of said reset resistance.

21. The method of claim 18, wherein the first of said second polarity pulses is applied after said last of said one or more reset pulses.

22. The method of claim 21, wherein the resistance of said device increases after application of said first of said second polarity pulses.

23. The method of claim 21, wherein a plurality of said second polarity pulses is applied after said last of said one or more reset pulses.

24. The method of claim 21, wherein said second polarity pulses are applied until the resistance of said device increases above a predetermined value.

25. The method of claim 17, wherein said first polarity pulses include one or more of said set pulses.

26. The method of claim 25, wherein said reset pulses and said set pulses are applied individually to said device in an alternating sequence.

27. The method of claim 25, wherein said first polarity pulses are positive polarity pulses.

28. The method of claim 1, wherein said first polarity pulses include pulses having a first energy and said second polarity pulses include pulses having a second energy.

29. The method of claim 14, wherein said first polarity pulses are applied until said phase-change memory device is transformed to a stuck set condition.

30. The method of claim 29, wherein the first of said second polarity pulses is applied after said phase-change memory device is transformed to said stuck set condition.

31. The method of claim 30, wherein said second polarity pulses increase the resistance of said phase-change memory device.

32. The method of claim 14, wherein said first polarity pulses are applied until said phase-change memory device is transformed to a stuck reset condition.

33. The method of claim 32, wherein the first of said second polarity pulses is applied after said phase-change memory device is transformed to said stuck reset condition.

34. The method of claim 33, wherein said second polarity pulses decrease the resistance of said phase-change memory device.

35. The method of claim 14, wherein said one or more first polarity pulses including at least two pulses applied in succession.

* * * * *